US012787215B2

(12) United States Patent
(10) Patent No.: US 12,787,215 B2
(45) Date of Patent: Nov. 3, 2026

Sun et al.

(54) CONTAINERIZED SINGLE-PHASE LIQUID IMMERSION COOLING SYSTEM

(71) Applicant: Hangzhou Dare Rouhan Technology Co., Ltd., Hangzhou (CN)

(72) Inventors: Minghui Sun, Hangzhou (CN); Shuwei Liu, Hangzhou (CN); Sheng Li, Hangzhou (CN)

(73) Assignee: Hangzhou Dare Rouhan Technology Co., Ltd., Hangzhou (CN)

( * ) Notice: Subject to any disclaimer, the term of this patent is extended or adjusted under 35 U.S.C. 154(b) by 61 days.

(21) Appl. No.: 18/423,335

(22) Filed: Jan. 26, 2024

(65) Prior Publication Data

US 2024/0349449 A1 Oct. 17, 2024

(30) Foreign Application Priority Data

Apr. 12, 2023 (CN) ......................... 202310386145.9

(51) Int. Cl.
*H05K 7/20* (2006.01)

(52) U.S. Cl.
CPC ..... *H05K 7/20236* (2013.01); *H05K 7/20263* (2013.01); *H05K 7/20272* (2013.01); *H05K 7/20772* (2013.01); *H05K 7/20836* (2013.01)

(58) Field of Classification Search
None
See application file for complete search history.

(56) References Cited

U.S. PATENT DOCUMENTS

| | | | | |
|---|---|---|---|---|
| 9,027,668 | B2 | 5/2015 | Zediker et al. | |
| 10,143,113 | B2 * | 11/2018 | Shelnutt | G06F 1/20 |
| 11,731,273 | B2 | 8/2023 | Cristache | |
| 11,849,534 | B2 | 12/2023 | Gao | |
| 2011/0132579 | A1 * | 6/2011 | Best | H05K 7/20281 165/104.31 |
| 2014/0307384 | A1 * | 10/2014 | Best | H05K 7/1497 361/679.53 |
| 2015/0048950 | A1 * | 2/2015 | Zeighami | H05K 7/2079 340/618 |
| 2015/0181762 | A1 * | 6/2015 | Boyd | H05K 7/20236 165/104.33 |
| 2019/0141861 | A1 * | 5/2019 | Shedd | H05K 7/20254 |
| 2023/0082410 | A1 * | 3/2023 | Enright | H05K 7/20318 361/679.46 |
| 2023/0247803 | A1 * | 8/2023 | Best | H05K 7/20381 165/104.31 |

* cited by examiner

*Primary Examiner* — Courtney L Smith

(57) ABSTRACT

A containerized single-phase liquid immersion cooling system includes a tank unit, a power distribution unit, a plate heat exchanger unit and a control unit that are disposed within a container, and a liquid cooling system disposed outside the container. A plurality of computational power servers are placed in each tank containing a cooling liquid, and the tank serves as a place for heat exchange between a cooling liquid and the computational power servers. The liquid cooling system is configured to cool a secondary-side medium from the plate heat exchanger unit. A bypass pipe is disposed between the plate heat exchanger unit and the liquid cooling system. The secondary-side medium in the bypass pipe serves as a heat source and is communicated with an external device through a hot water outlet to recover waste heat, and the medium cooled after waste heat utilization returns to a primary-side pipe.

10 Claims, 12 Drawing Sheets

| Illustration | Name | Illustration | Name | Illustration | Name |
|---|---|---|---|---|---|
|  | Motor | 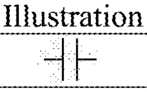 | Flange |  | Instrument |
|  | Water-water heat exchanger |  | Hose | 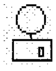 | Other flowmeter |
| 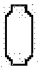 | Ion exchanger |  | Circulating water pipe |  | Float type flowmeter |
| 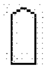 | Nitrogen cylinder |  | Dividing line |  | Butterfly valve |
| 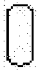 | Pressure container | 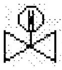 | Electric valve |  | Pump |
| 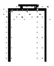 | Water supplementing container |  | Exhaust Valve |  | Fan |
| 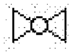 | Ball valve (normally open) |  | Drainage valve |  | Compressor |
|  | Ball valve (normally closed) |  | Safety valve | 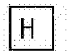 | Electric heater |
|  | Check valve |  | Adjustable pressure reducing valve | 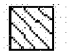 | Mechanical filter |
|  | Three-way valve (L type) | 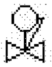 | Pressure regulating valve |  | Stop valve |
|  | Stop valve | | | | |

FIG. 10

| Initial Letter | Description | Initial Letter | Description | Initial Letter | Description | Initial Letter | Description |
|---|---|---|---|---|---|---|---|
| C | Container | V | Valve | F | Flow rate | A | Alert |
| H | Heater | W | Hose | L | Liquid level | C | Control |
| G | Fan | Z | Filter | P | Pressure | I | Scene indication |
| K | Actuated valve | R | Compressor | Q | Electrical conductivity | S | Switch quantity output |
| M | Motor | S | Throttle apparatus | T | Analog quantity output | T | Analog quantity output |
| P | Pump | | | d | Differential | E | Cooler |

FIG. 11

CONTAINERIZED SINGLE-PHASE LIQUID IMMERSION COOLING SYSTEM

CROSS-REFERENCE TO RELATED APPLICATIONS

This application claims priority to Chinese Patent Application No. 202310386145.9 with a filing date of Apr. 12, 2023. The content of the aforementioned application, including any intervening amendments thereto, is incorporated herein by reference.

TECHNICAL FIELD

The present disclosure belongs to the technical field of temperature control, relates to a containerized data center, and in particular to a containerized single-phase liquid immersion cooling system.

BACKGROUND

Air cooling is used as a mainstream solution currently for server heat dissipation/chip heat dissipation. However, the bottleneck of air cooling is coming due to low density and low specific heat capacity of air. Moreover, an increasing high quantity of heat is generated per unit area due to the chip size reduced from 7 nm to 5 nm, and even to 3 nm. When air cooling meets the requirement of heat dissipation, the density of servers may decrease, and the cost is equivalently increased. If the density of servers remains unchanged, air cooling cannot meet the requirement of heat dissipation within a unit volume. Therefore, liquid cooling has received increasing attention.

Liquid cooling is further classified into water-cooled plate-type liquid cooling and oil immersion cooling. The water-cooled plate-type water cooling is that water comes into contact with a chip by means of enclosed aluminum housing. Water has considerably higher heat dissipation properties such as density and specific heat capacity than air, but the threshold in design for water-cooled plate-type water cooling is high since the water-cooled plate has to be designed together with a printed circuit board (PCB). Regarding the oil immersion cooling, an air-cooled server can be immersed in oil having stronger heat dissipation capability. The oil immersion cooling has attracted extensive attention due to small modification to a server, a low threshold, and strong heat dissipation capability.

Oil cooling is further classified into single-phase oil cooling and two-phase oil cooling. Although exhibiting stronger heat dissipation capability, the two-phase oil cooling involves the phase change of oil, and has a high requirement on the airtightness of a container. Moreover, the cost of heat dissipation by oil evaporation is very high. How to achieve better heat dissipation effect at low cost is crucial.

SUMMARY OF PRESENT INVENTION

An objective of the present disclosure is to provide a containerized single-phase liquid immersion cooling system. With the single-phase liquid immersion cooling, the current requirement of heat dissipation can be met and low cost is guaranteed. The whole product may be prefabricated in a factory as an engineering product. The containerized single-phase liquid immersion cooling system can operate at a site as long as power, water and network are available. The quantity and time of construction on the site can be greatly reduced while the quality and the delivery time are guaranteed.

To solve the above-mentioned technical problem, the technical solutions adopted in the present disclosure are as follows. A containerized single-phase liquid immersion cooling system includes a tank unit, a power distribution unit, a plate heat exchanger unit and a control unit that are disposed within a container, and a liquid cooling system disposed outside the container.

The tank unit includes a plurality of tanks disposed in parallel. A plurality of computational power servers are placed in each tank containing a cooling liquid, and the tank serves as a place for heat exchange between the cooling liquid and the computational power servers.

The liquid cooling system is configured to cool a secondary-side medium from the plate heat exchanger unit and dissipate heat to an external environment. A bypass pipe is disposed between the plate heat exchanger unit and the liquid cooling system. The secondary-side medium in the bypass pipe serves as a heat source and is communicated with an external device through a hot water outlet to recover waste heat, and the medium cooled after waste heat recovery returns to a cold water pipe.

The plate heat exchanger unit serves as a heat exchange center to cool the tank unit.

The power distribution unit supplies power for the liquid immersion cooling system.

The control unit provides a stable flow rate and pressure for the liquid immersion cooling system, and monitors and maintains operation of the liquid immersion cooling system.

In one embodiment, the tank unit includes one water outlet pipe and one water return pipe that are shared by the plurality of tanks disposed in parallel. A flow channel for a medium flowing out from the tanks is defined as the water outlet pipe and a flow channel for a medium flowing into the tanks is defined as the water return pipe. The medium from the tanks is communicated with the plate heat exchanger unit through the water outlet pipe, and the medium cooled after heat exchange flows into the tanks through the water return pipe.

In one embodiment, a pressure transmitter, a temperature transmitter, an external circulating water pump, a flow rate sensor, a control valve and an exhaust valve are disposed in sequence in the water outlet pipe between the tanks and the plate heat exchanger unit. The water outlet pipe further includes a bypass branch having one end disposed between the flow rate sensor and a butterfly valve and the other end disposed between a manually operated exhaust valve and the plate heat exchanger unit, and a filter is disposed in the bypass branch.

In one embodiment, a plurality of computational power servers are placed in each tank and arranged into a plurality of layers up and down, and power interfaces of the computational power servers are all placed downwards. The water return pipe is laid in parallel to a length direction of the tank and arranged along bottoms of the computational power servers, and a hole is formed in an upper surface of the water return pipe.

In one embodiment, a liquid return box is further disposed within each tank. The water outlet pipe is connected to a bottom of the liquid return box. The water outlet pipe has a removable portion, and the removable portion is selectively mounted according to a height of the liquid return box. The liquid return box is of a box-shaped structure with open side up. Two ends of the liquid return box are removably connected to an inner wall of the tank. A mesh is mounted within the liquid return box.

In one embodiment, the liquid cooling system includes a cooling tower, a secondary-side pipe for connection with a secondary-side medium outlet of the plate heat exchanger unit and the cooling tower, and a primary-side pipe for connection with the cooling tower and a primary-side medium inlet of the plate heat exchanger unit.

In one embodiment, a temperature transmitter, a pressure transmitter and a valve are disposed in the secondary-side pipe. A filter, an exhaust valve, an internal circulating water pump, a temperature transmitter and a pressure transmitter are disposed in the primary-side pipe.

In one embodiment, a power of the internal circulating water pump is selected according to a medium flow rate and a medium transport path. A total power is greater than a theoretically calculated power, and a safety coefficient is more than 1.5 times of a theoretically calculated safety coefficient.

In one embodiment, the container has an overall protection grade of IP53 and a corrosion-proof grade of C3, and a fan, a temperature and humidity transmitter and a leaking oil detection sensor are further disposed on the container.

In one embodiment, a double door is disposed at one end of the container in a length direction as a passage for daily operation and maintenance equipment and personnel to go in and out. A fresh air inlet shutter is disposed on the double door. A fresh air exhaust fan is disposed within the container at a position corresponding to the fresh air inlet shutter. An access control card reader is further disposed outside the double door to authenticate identity. An inspection door is disposed on one side of the container in the length direction as a door for maintenance of the plate heat exchanger unit and water pumps.

Compared with the prior art, the present disclosure has the following advantages and positive effects:

1. The whole structure of the present disclosure is modularly designed and modularized into a tank unit, a power distribution unit, a plate heat exchanger unit, a control unit and a liquid cooling system. Each module may be independently assembled into a modular structure. A plurality of modules may be assembled simultaneously outside a container, and then arranged in the container for general connection and assembly after being assembled separately. By such simultaneous assembling, the efficiency may be improved. Moreover, assembling outside the container is not limited by space so that the assembling efficiency can be further improved, and is convenient for subsequent repair. When local repair is needed, an individual module may be replaced and repaired. A point where maintenance is needed may be identified rapidly and replacement may be made thereto. On this basis, the tank unit is further divided into a plurality of independent tanks disposed in parallel. Each tank is runnable independently and the plurality of tanks are runnable simultaneously, which may be adjusted as needed, thereby reducing the energy consumption. On this basis, servers within each module are disposed in parallel up and down. When one of servers is out of order, it may be directly replaced without affecting the operation and connection of other servers. The structure described above is equivalent to a three-stage modular arrangement of the whole structure. The assembling efficiency and the stability of device operation are greatly improved, and subsequent maintenance cost is reduced.
2. The plate heat exchanger unit provided in the present disclosure is configured to realize heat exchange between a medium for cooling the tanks and a cooling medium in the cooling tower. That is, the plate heat exchanger unit realizes exchange of heat and guarantees a low temperature of the cooling medium in the tanks. The high-temperature medium after heat exchange through the plate heat exchanger unit passes through the liquid cooling system to become the cooling medium again and then enters the plate heat exchanger unit again. Such a process is repeated to meet the requirement of continued cooling. Meanwhile, a bypass pipe is disposed between the plate heat exchanger unit and the liquid cooling system. A secondary-side medium in the bypass pipe serves as a heat source and is communicated with an external device through a hot water outlet for recovery of waste heat to recover waste heat for heating or other functions, e.g., for heat utilization scenarios such as agricultural greenhouses, industrial factory buildings, office buildings and aquaculture. After the temperature of the medium after waste heat utilization is reduced, the medium returns to a primary-side pipe through a cold water return port for recovery of waste heat. A closed-loop system is thus formed. Continued cooling of the tanks and continued heating can be realized.
3. In the present disclosure, a water return pipe is laid in parallel to a length direction of each tank and arranged along bottoms of the computational power servers. An outlet of cooling oil can be aligned to the computational power servers, providing better cooling effect. A hole is formed in an upper surface of the water return pipe such that oil comes out more uniformly. Thus, the cooling effect on each server is more uniform.
4. In the present disclosure, a liquid return box is further disposed within each tank. A water outlet pipe is connected to a bottom of the liquid return box. The water outlet pipe has a removable portion. When a height of the liquid return box needs to be reduced, the removable portion is removed. The liquid return box is of a box-shaped structure with open side up. Two ends of the liquid return box are removably connected to an inner wall of the tank such that the liquid return box is adaptable to the computational power servers at different heights. The height of the liquid return box can be adjusted at any time according to the heights of the computational power servers, which may be beneficial to collection and return of the cooling medium after cooling. A mesh is mounted on the liquid return box so that a return flow can be more uniform.
5. In the present disclosure, a power of a main circulating water pump is selected according to a medium flow rate and a medium transport path. The power of the main circulating water pump is determined, and a specification of the main circulating water pump is determined according to the power. A total power is greater than a theoretically calculated power. Low frequency operation is selected to reduce vibration, guaranteeing better stability within the whole system. The performance of each component is more reliable, and the vibration of the whole container is reduced.
6. By comprehensively evaluating the technical solutions of the present disclosure, as presented in the present disclosure, the heat dissipation way is more efficient: the liquid immersion cooling exhibits strong heat dissipation capability and can take away heat more efficiently than air cooling; the solution is more reliable:

the liquid immersion cooling can reduce common problems such as system overheating and temperature fluctuation during the operation of a server to the utmost extent; overclocking is more powerful: with the aid of the liquid immersion cooling, an overclocking range of a server is 50%-70%; the arrangement is more farseeing: the quantity of heat generated per $cm^2$ by a 5 nm packaged chip is about 30 W, and the quantity of heat dissipation per $cm^2$ for a chip increases with narrowing manufacture procedure; and the liquid immersion cooling having much better heat dissipation effect than air cooling is selected as advanced arrangement to adapt to the development of the technology; and the environmental adaptability is stronger: the system is runnable at ambient temperatures from −40° C. to 50° C. The Environment application range is extremely wide, and the influence of the environment on the operation of a server is reduced to the utmost extent. No indoor scene needs to be set up. In an environment at an extreme temperature, the power-saving performance and the heating function characteristics can be reflected better.

BRIEF DESCRIPTION OF THE DRAWINGS

The accompanying drawings which constitute a part of the description of the present disclosure are intended to provide further understanding of the present disclosure. The exemplary embodiments of the present disclosure and descriptions thereof are intended to be illustrative of the present disclosure and do not constitute an undue limitation of the present disclosure. In the drawings:

FIG. 10 is a table showing illustrations and names of graphic symbols according to the present disclosure.

FIG. 11 is a table showing initial letters of alphabetic symbols and descriptions thereof according to the present disclosure.

REFERENCE NUMERALS

Figure 1:
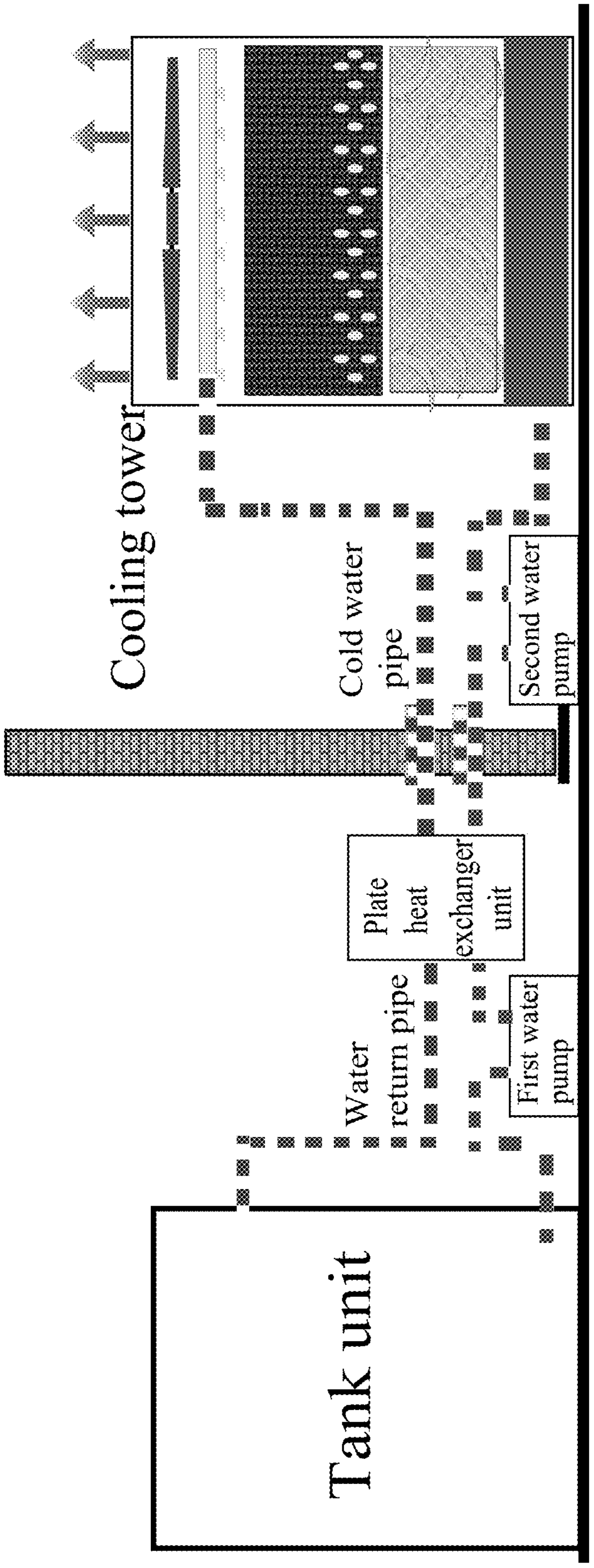
FIG. 1 is a diagram illustrating an overall operating principle of a containerized single-phase liquid immersion cooling system according to the present disclosure.

1—liquid cooling system; 101—cooling tower; 2—container; 201—leaking oil detection sensor; 202—temperature and humidity transmitter; 203—fan; 3—fresh air inlet shutter; 4—double door; 5—access control card reader; 6—main cable/copper bar connection interface; 7—inspection door; 8—hot-water pipe; 9—cooling pipe; 10—hot water outlet for recovery of waste heat; 11—cold water return port for recovery of waste heat; 12—tank unit; 13—power distribution unit; 14—control unit; 15—plate heat exchanger unit; 16—external circulating water pump; 17—internal circulating water pump; 18—fresh air exhaust fan; 19—housing grounded point; 20—step for personnel to walk upon; 21—water return pipe; and 22—water outlet pipe.

DETAILED DESCRIPTION OF THE EMBODIMENTS

It should be noted that embodiments in the present disclosure or features in the embodiments may be combined with one another without conflict.

It should be understood that in the description of the present disclosure, terms such as “central”, “longitudinal”, “transverse” “upper”, “lower”, “front”, “rear”, “left”, “right” “vertical”, “horizontal”, “top”, “bottom”, “inside” and “outside” indicate the orientations or positional relationships based on the drawings, and these terms are merely intended to facilitate and simplify the description of the present disclosure, rather than to indicate or imply that the mentioned apparatus or element must have a specific orientation or must be constructed and operated in a specific orientation, and thus cannot be construed as limitations to the present disclosure. Moreover, terms such as “first” and “second” are used only for the purpose of description and cannot be understood as indicating or implying relative importance or implicitly indicating the number of technical features denoted. Thus, features defined with “first” and “second” may explicitly or implicitly include one or more of the features. In the description of the present disclosure, unless otherwise specified, “a plurality of” means two or more.

In the description of the present disclosure, it should be noted that, unless otherwise clearly specified, meanings of terms “mount”, “connected with”, and “connected to” should be understood in a board sense. For example, the connection may be a fixed connection, a removable connection, or an integral connection; may be a mechanical connection or an electrical connection; may be a direct connection or an indirect connection by using an intermediate medium; or may be intercommunication between two elements. A person of ordinary skill in the art may understand specific meanings of the above terms in the present disclosure based on a specific situation.

The specific embodiments of the present disclosure are described in detail below with reference to the accompanying drawings.

“Computational power” is normally regarded as data processing capability. Ranging from mobile phones and laptops to super computers, the computational power exists in various intelligent hardware devices. Without the computational power, various kinds of software and hardware cannot operate normally. Artificial intelligence (AI) is unlike water without a source and a tree without roots. AI needs to be supported by the computational power of a hardware chip when completing each face recognition or each speech-to-text conversion.

Laptops available for ordinary people have different configurations with different prices, which mainly depend on differences of CPUs, graphics cards, internal storages and the like carried by products having different configurations. A laptop with a high-level configuration may have higher computational power, with which a game requiring a higher-level configuration can be played, and may run more internal storage consuming 3D and audio-visual software. A laptop with a low-level configuration may have insufficient computational power and can only run ordinary games and ordinary office software. For a same online game, the online game can be run more smoothly on a mobile phone with higher computational power, and if the computational power of a mobile phone is insufficient, the game may encounter lag.

A liquid cooling server refers to a liquid injected server, which is a server with heat dissipation by cool and heat exchange. Servers may be distinguished by physical form between a cold-plate type liquid cooled server and a fully-immersed liquid cooled server.

Liquid immersion cooling is typical direct contact type liquid cooling in which electronic elements generating heat are immersed in a coolant (cooling liquid) such that the heat is taken away by circulation flow of the liquid.

Since the elements generating heat are in full direct contact with the coolant, the liquid immersion cooling exhibits higher heat dissipation efficient than traditional heat dissipation ways: air cooling and water cooling, and exhibits lower noise than cold-plate or spraying liquid cooling.

In two-phase liquid immersion cooling, by means of the boiling and condensation processes of an electronic fluorinated liquid, the heat transfer efficiency of the liquid may be improved exponentially. Electronic components are directly immersed in a dielectric liquid in a container which is sealed but easy to operate. In the container, heat is transferred from the electronic components to the liquid and causes the liquid to boil and produce steam. The steam condenses on a heat exchanger (condenser) within the container to transfer heat to facility cooling water circularly flowing in a data center. The cooling liquid experiences a phase change during circular heat dissipation. The cooling liquid experiences phase change evaporation after taking away the heat from electronic elements, and the gaseous cooling liquid is condensed by other devices into liquid. Two-phase liquid cooling exhibits extremely high heat transfer efficiency since the cooling liquid experiences the phase change. It is disadvantageous that in this phase change process, the cooling liquid will escape when evaporating into the gaseous state, and therefore, a certain requirement is imposed on the airtightness of the container. However, to prevent an accident due to the interruption of the liquid cooling system, the container cannot be sealed too tightly, and therefore, a certain safety measure is needed.

Traditionally, in single-phase liquid immersion cooling, an electronic fluorinated liquid keeps the liquid state. Electronic components are directly immersed in a dielectric liquid in a container which is sealed but easily accessible, and heat is transferred from the electronic components into the liquid. A circulating pump is often used to force the heated electronic fluorinated liquid to flow to a heat exchanger, and the electronic fluorinated liquid is cooled in the heat exchanger and circulates back to the container. The cooling liquid always keeps the liquid state during circular heat dissipation and experiences no phase change. After taking away the heat, the temperature of the low-temperature cooling liquid rises, and the warmed cooling liquid flows to other areas for re-cooling, thereby completing circulation. The single-phase liquid cooling requires a high boiling point of the cooling liquid, thereby making control on volatilization loss of the cooling liquid relatively simple, and has good compatibility with components of IT devices and does not require frequent supplementation of the cooling liquid. However, the single-phase liquid cooling exhibits lower heat dissipation efficiency than the two-phase liquid cooling.

A power distribution unit (PDU) power strip, also referred to as a PDU socket, is a power distribution manager having a power distribution and management function. A PDU power socket is a first and most closely related component for the operation of a plurality of devices, and the quality of the PDU directly affects each device. A PDU series cabinet socket type power protection lightning arrestor is designed in accordance with the IEC standard, dedicated for fine protection of sensitive devices with single-phase alternating current power supply, and applied to a device terminal as third-stage power supply protection, protecting the device against damage of a transient overvoltage generated by lightning stroke or electronic interference. This power protection lightning arrestor, to which two-stage tandem linked protection is applied, may have a maximum current flux of up to 20 kA and a voltage protection level of as low as 800 V, and the input and output thereof is compatible with standard plugs of a plurality of countries and various kinds of power matching. The power protection lightning arrestor is provided with a recoverable overload protector. The lightning arrestor is perfectly combined with a power strip. The PDU power socket is a novel socket device, and its safety coefficient is reliable. The PDU power socket is configured to receive direct current (DC) power in various miniature electronic machines such as a mobile phone, and a power socket for a pin plug is disposed in the center of a plug jack.

A plate heat exchanger, which is an efficient heat exchanger formed by a series of stacked metal sheets having a certain corrugated shape, is formed by stacking and holding down many stamped corrugated sheets using a frame and hold-down screws at certain intervals with a gasket disposed therearound for sealing. Holes at four corners of the sheets and the gasket form a distribution pipe and a collection pipe for a fluid. Meanwhile, cold and hot fluids are separated reasonably and allowed to flow in flow channels on two sides of each sheet, respectively. Heat exchange is achieved through the sheets. Thin rectangular channels are formed between various sheets, and heat exchange is achieved through the sheets. The plate heat exchanger is an ideal device for liquid-liquid heat exchange and liquid-steam heat exchange. The plate heat exchanger is high in heat exchange efficiency, low in heat loss, compact and light in structure, small in floor area, wide in application, and long in service life.

A cooling tower is an apparatus that uses water as a circulating coolant to absorb heat from a system and dissipate the heat to the atmosphere to reduce the temperature of the water. The cooling tower is an evaporating heat dissipating apparatus that, in order to guarantee normal operation of the system, dissipates industrial waste heat or waste heat generated in a refrigeration air conditioner based on principles such as evaporating heat dissipation, convective heat transfer and radiative heat transfer, where the evaporating heat dissipation is achieved in such a manner that water is in flowing contact with air for cold-heat exchange to produce steam and the steam volatilizes to take away heat. The apparatus is generally barrel-shaped and thus called the cooling tower.

Figure 2:
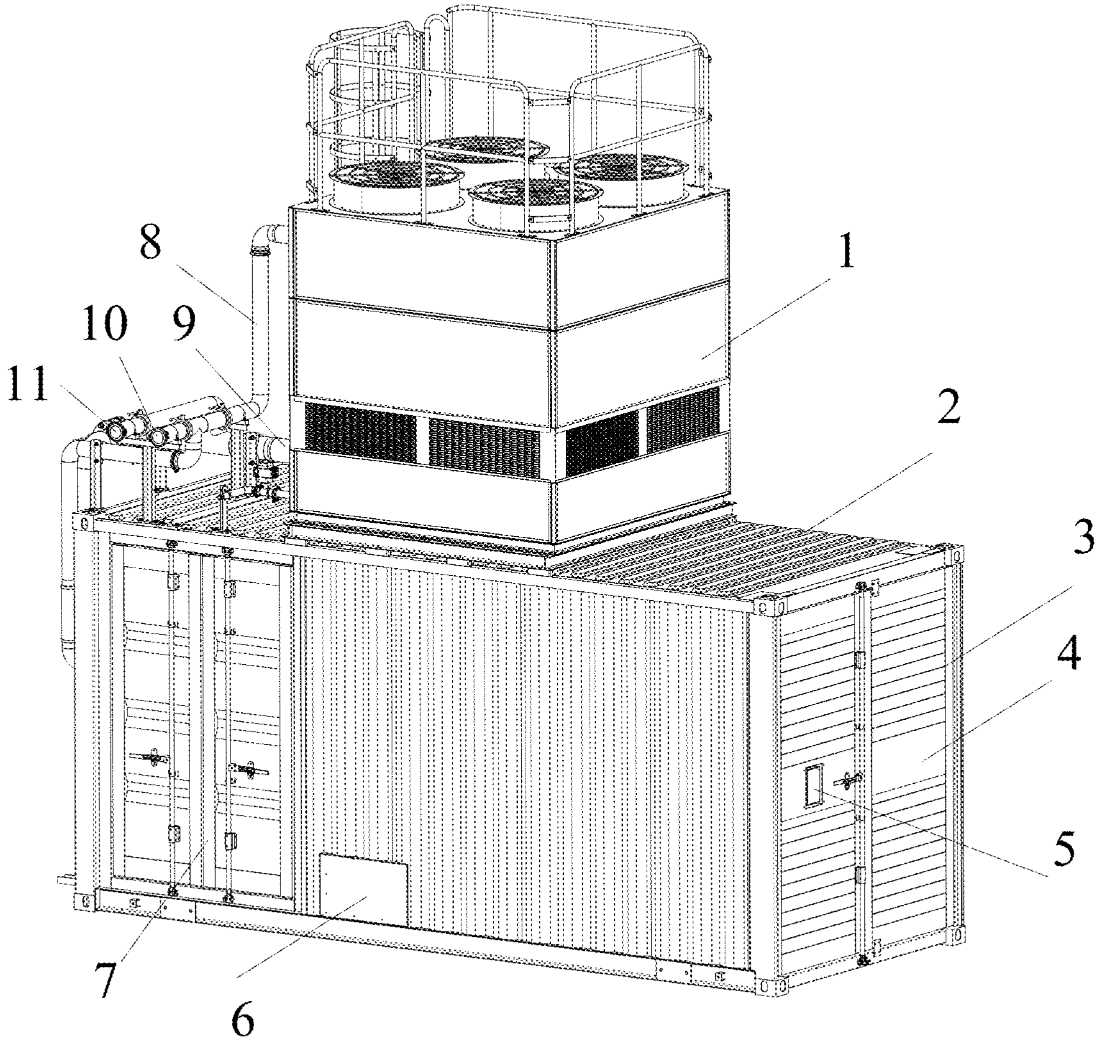
FIG. 2 is a structural schematic diagram of a containerized single-phase liquid immersion cooling system according to the present disclosure.
Figure 3:
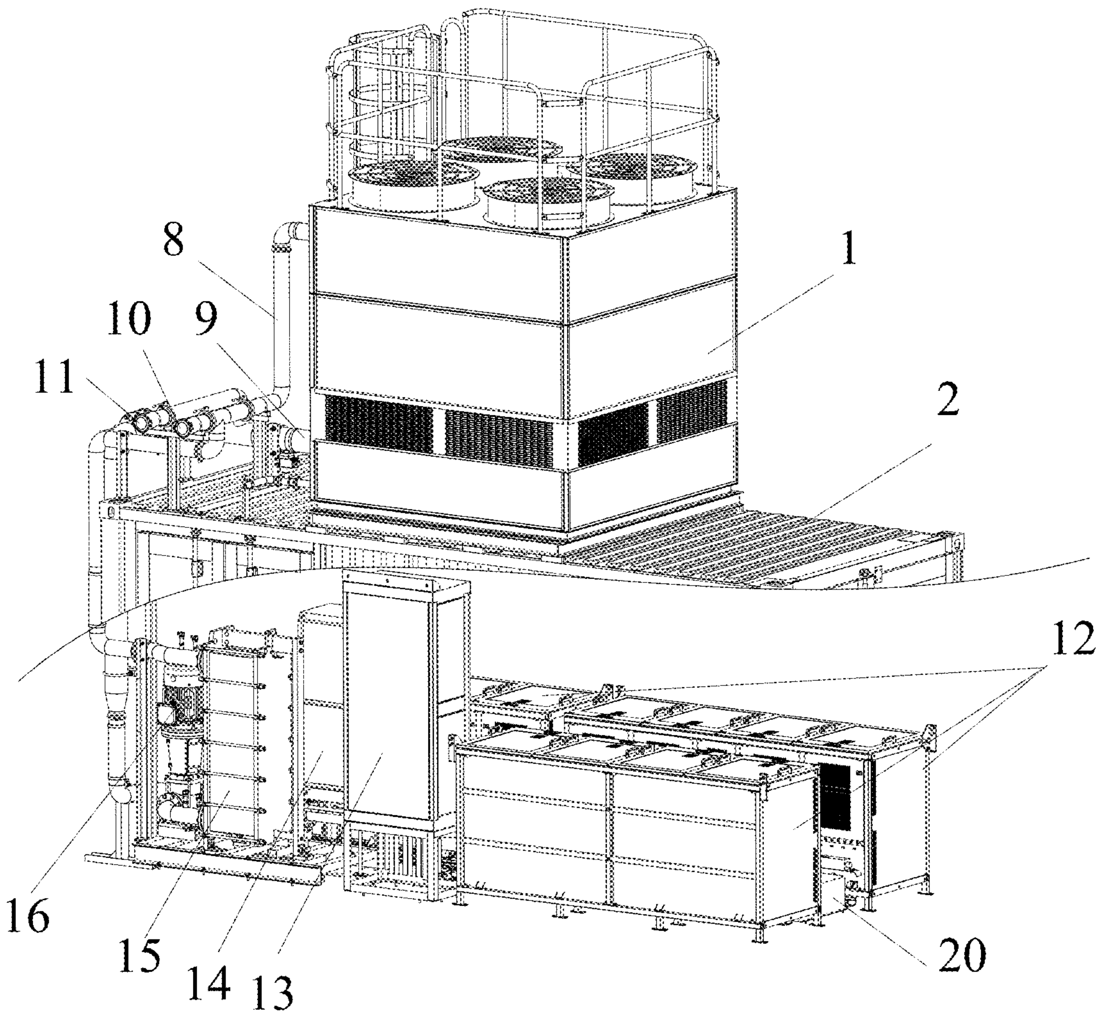
FIG. 3 is a partial cross-sectional structural schematic diagram of a containerized single-phase liquid immersion cooling system according to the present disclosure viewed from the front.
Figure 4:
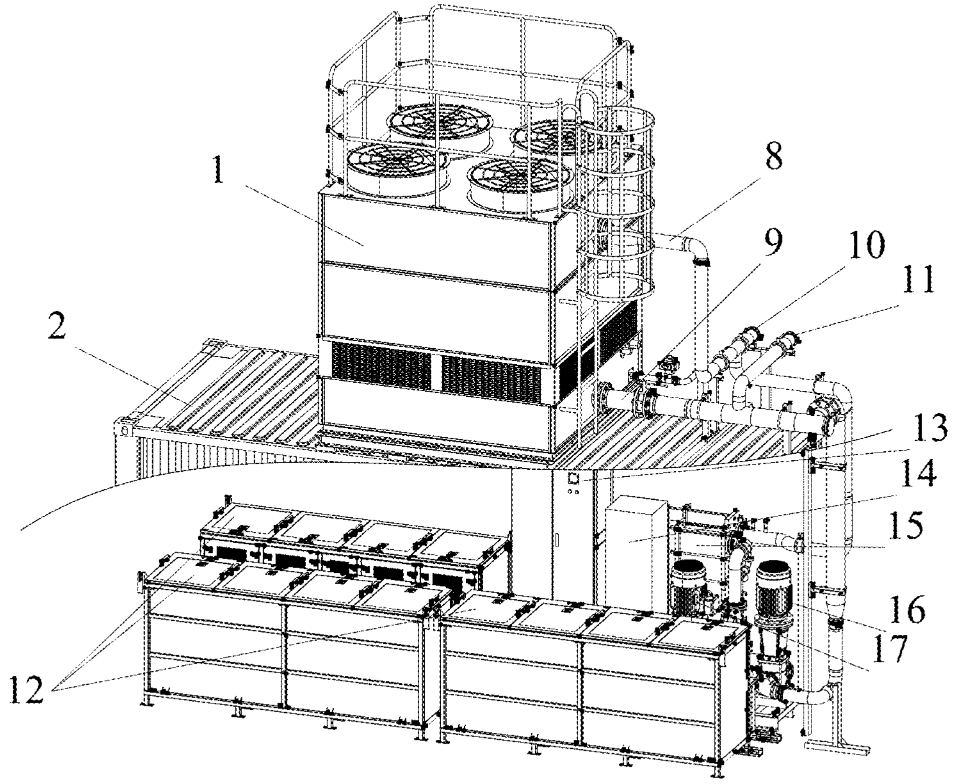
FIG. 4 is a partial cross-sectional structural schematic diagram of a containerized single-phase liquid immersion cooling system according to the present disclosure viewed from the back.
Figure 5:
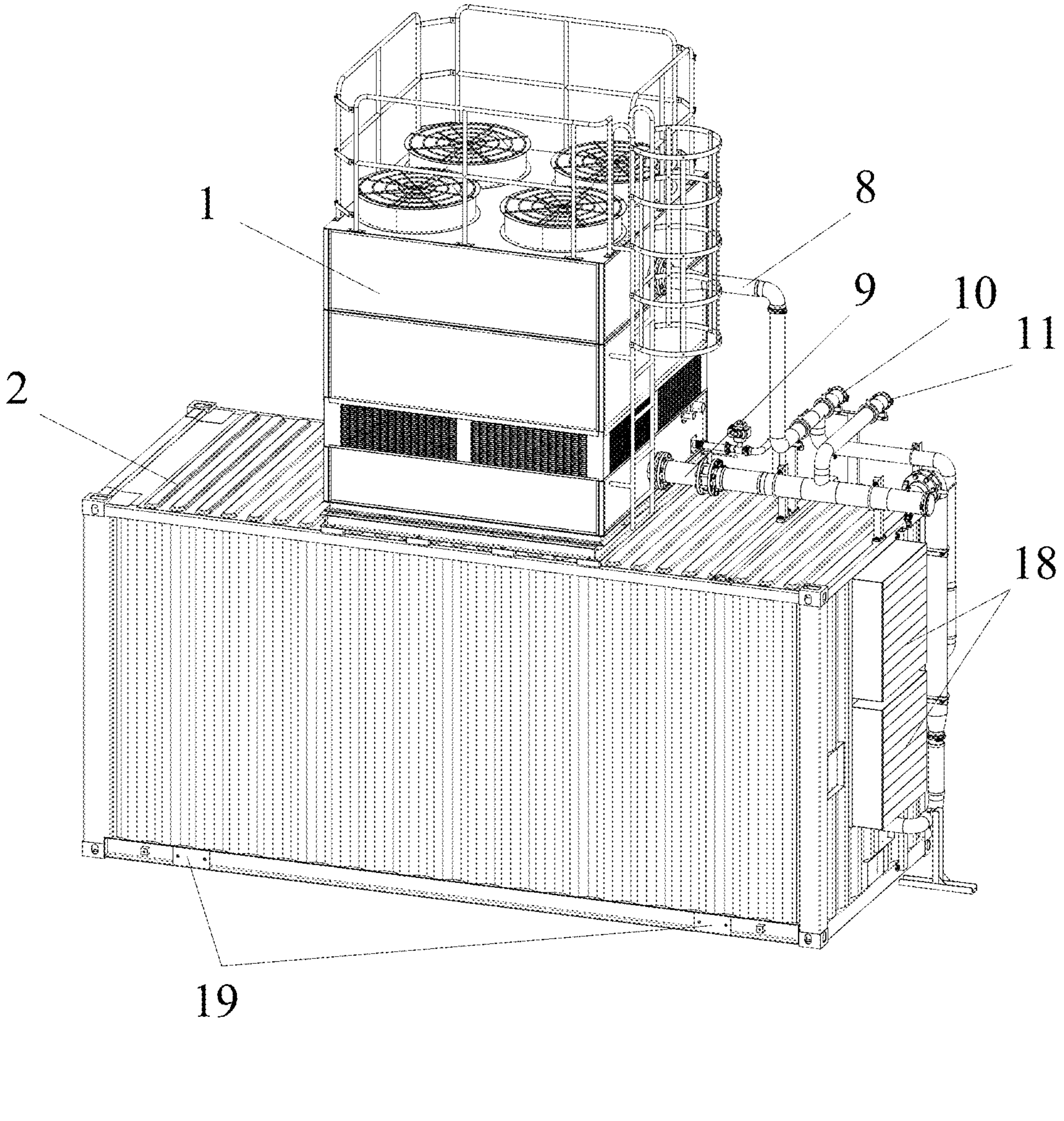
FIG. 5 is a structural schematic diagram of a containerized single-phase liquid immersion cooling system according to the present disclosure viewed from the back.
Figure 6:
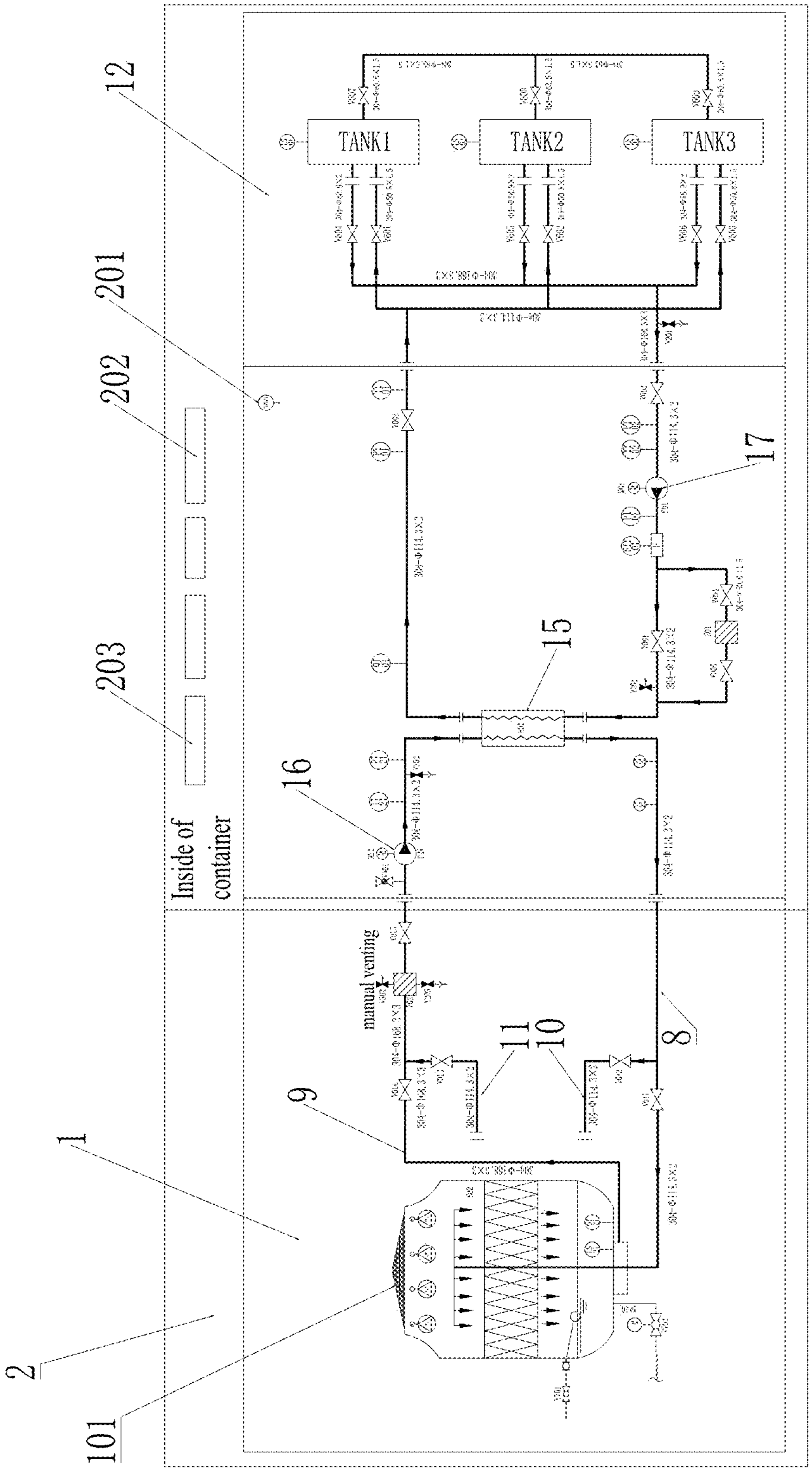
FIG. 6 is a diagram illustrating a principle of a containerized single-phase liquid immersion cooling system according to the present disclosure.
Figure 7:
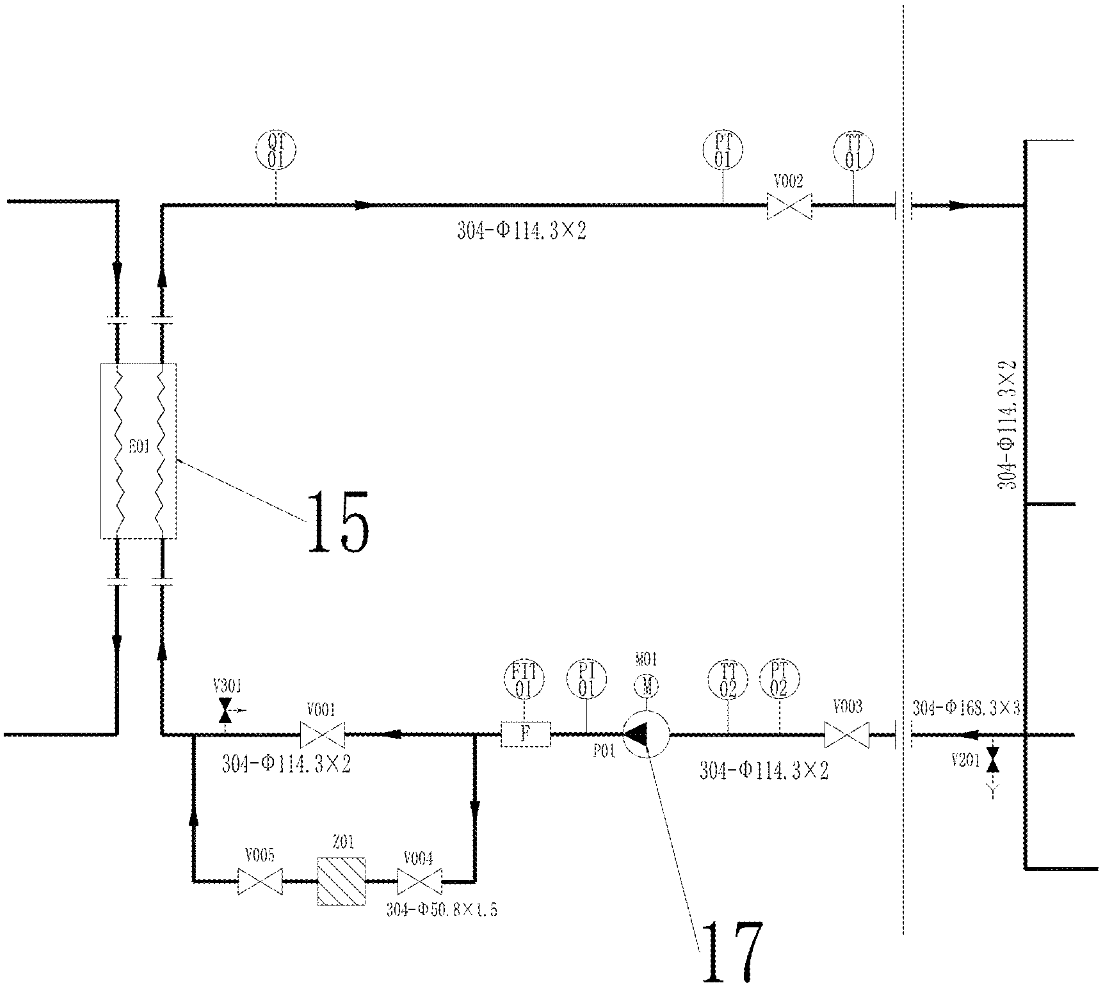
FIG. 7 is a diagram illustrating a principle of communication of a plate heat exchanger unit, a water inlet pipe and a water return pipe according to the present disclosure.
Figure 8:
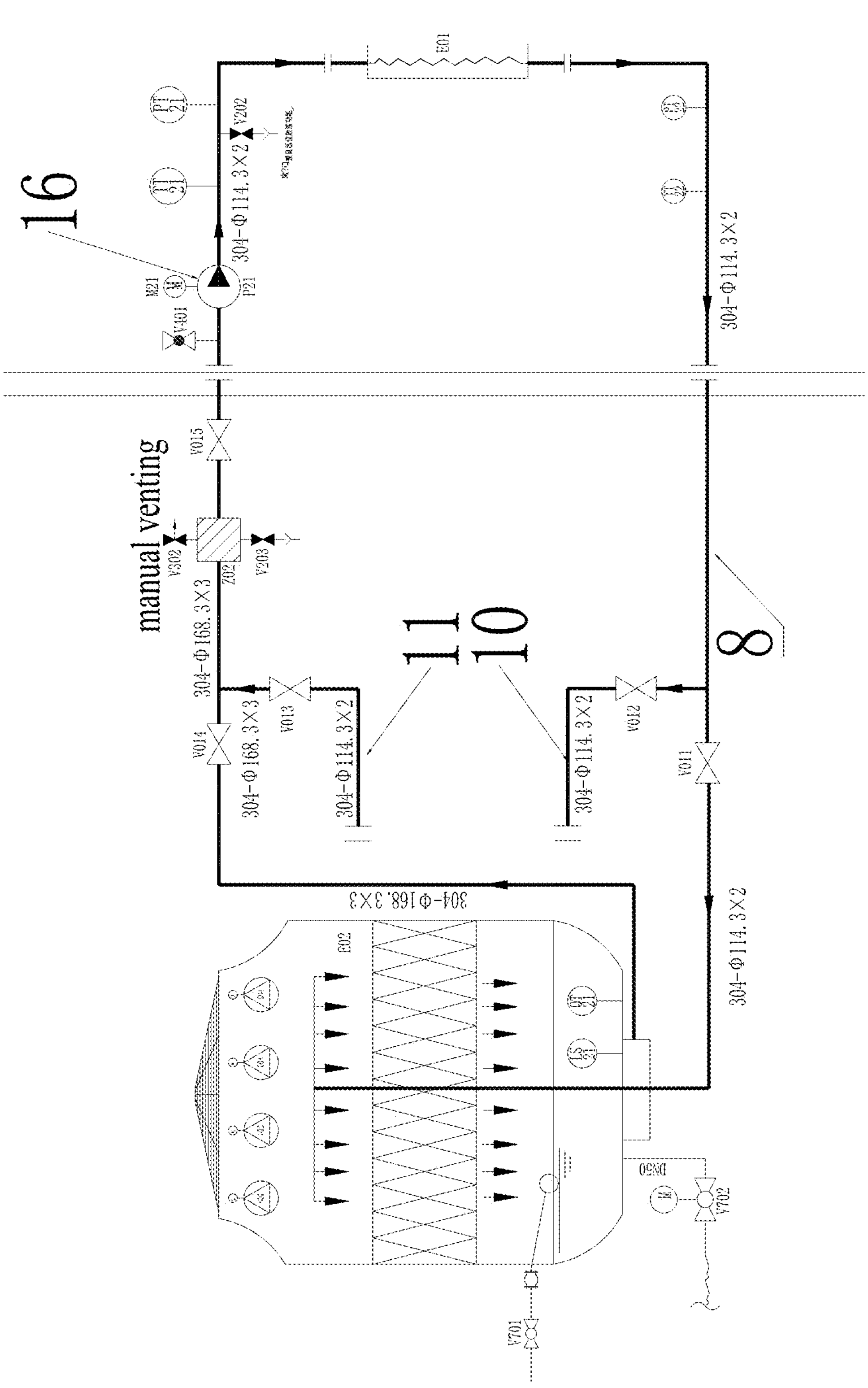
FIG. 8 is a diagram illustrating a principle of a liquid cooling system according to the present disclosure.
Figure 9:
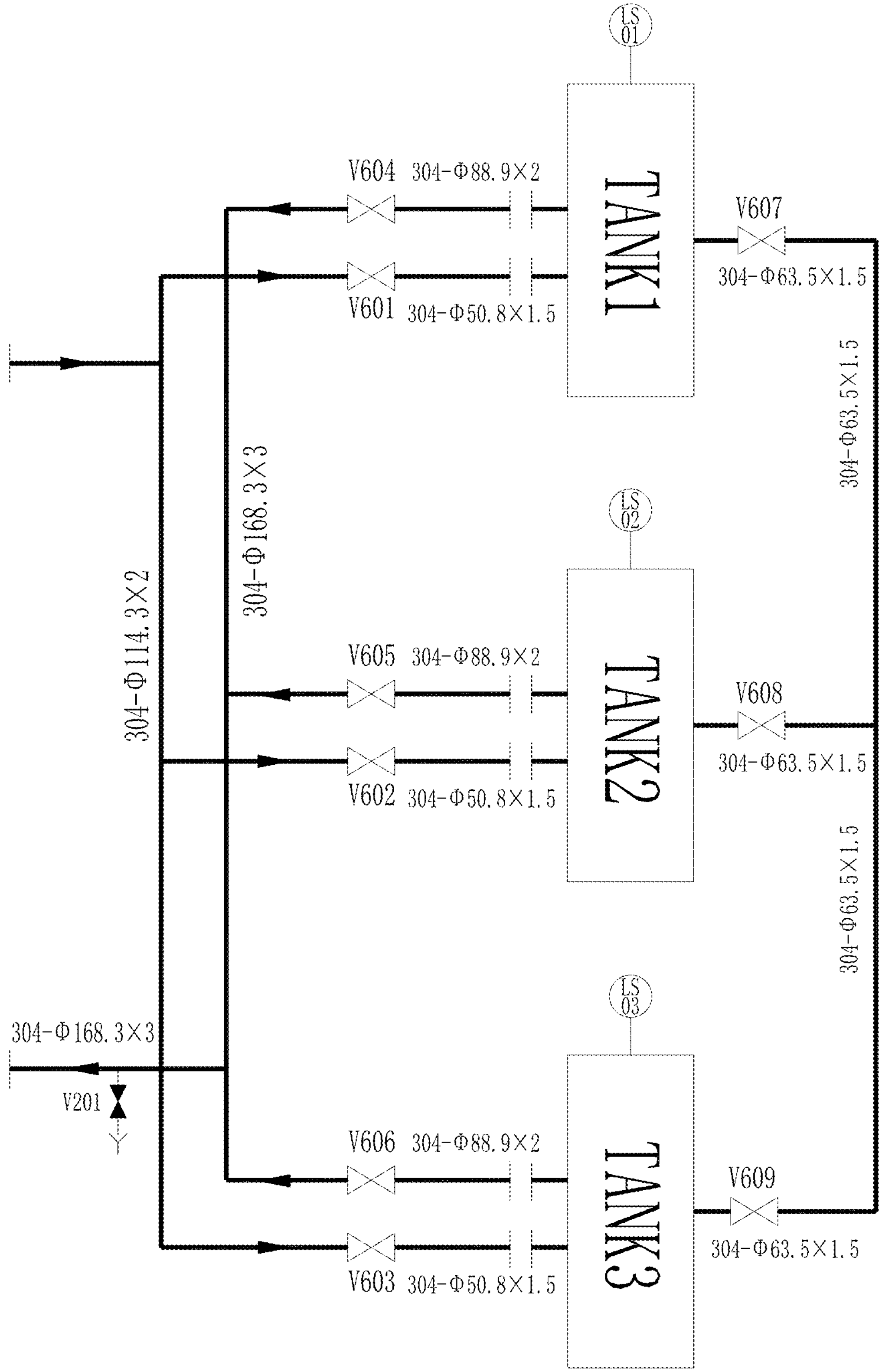
FIG. 9 is a diagram illustrating a connection layout in which tank units are arranged in parallel according to the present disclosure.
Figure 12:
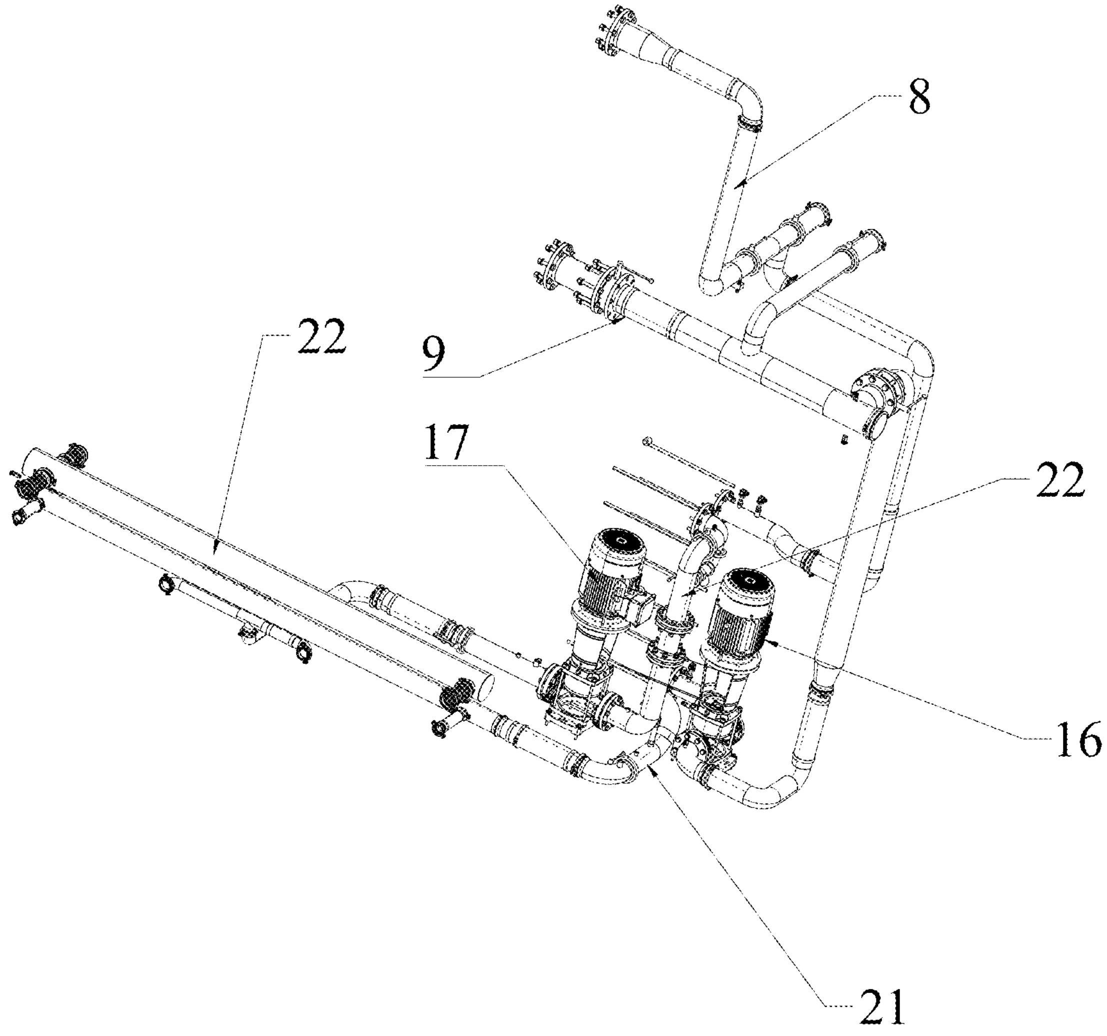
FIG. 12 is a structural schematic diagram illustrating connection of a water inlet pipe, a water return pipe, a cold water pipe, a hot water pipe, an external circulating water pump and an internal circulating water pump according to the present disclosure.

As shown in FIG. 1 to FIG. 12, the present disclosure provides a containerized single-phase liquid immersion cooling system. The containerized single-phase liquid immersion cooling system includes a tank unit, a power distribution unit, a plate heat exchanger unit and a control unit that are disposed within a container, and a liquid cooling system disposed outside the container. In the present disclosure, the liquid cooling system is disposed on the top of the container. Smaller space is occupied in the vertical direction such that the whole structure is more compact.

The tank unit includes a plurality of tanks disposed in parallel. Each tank serves as a container for a cooling liquid, internally has a plurality of computational power servers, and serves as a place for heat exchange between the cooling liquid and the computational power servers.

The power distribution unit supplies power for all devices in the container with three-phase five-wire 380 V to 415 V and alternating current 50/60 Hz, and reliable grounded point is provided in field application.

The liquid cooling system, which is a cooling tower in the present disclosure, is configured to cool a secondary-side medium from the plate heat exchanger unit and dissipate heat to an external environment. After heat exchange through the plate heat exchanger unit, the secondary-side medium in a bypass pipe which is disposed between the plate heat exchanger unit and the liquid cooling system serves as a heat source and is communicated with an external device through a hot water outlet for recovery of waste heat to recover waste heat for heating or other functions, e.g., for heat utilization scenarios such as agricultural greenhouses, industrial factory buildings, office buildings and aquaculture. After the temperature of the medium after waste heat utilization is reduced, the medium returns to a cooling pipe through a cold water return port for recovery of waste heat.

The plate heat exchanger unit is configured to realize heat exchange between a medium for cooling the tanks and a cooling medium in the cooling tower. That is, the plate heat exchanger unit realizes exchange of heat and guarantees a low temperature of the cooling medium in the tanks. The high-temperature medium after heat exchange through the plate heat exchanger unit passes through the liquid cooling system to become the cooling medium again and then enters the plate heat exchanger unit again. Such a process is repeated to meet the requirement of continued cooling. In the present disclosure, the plate heat exchanger unit is a plate heat exchanger.

The liquid cooling system is divided into two parts: a primary side (i.e., cold side) and a secondary side (hot side). The primary side is also called the cold side, and the secondary sided is also called the hot side. The secondary side part is connected to the tank unit equipped with a cooling server through a pipe, and the heat exchange medium is insulating cooling oil. The primary side part is connected to an external open-type cooling tower through a pipe, and the heat exchange medium is water. The cooling medium of the secondary side (hot side) flows through the plate heat exchanger after experiencing pressure boosting by an internal circulating pump. The medium in a water outlet pipe exchanges heat with the medium of the primary side (cold side) through the plate heat exchanger unit and then enters the tank unit to take away heat, and returns to the internal circulating pump again for recirculation.

The tank unit includes one water outlet pipe and one water return pipe that are shared by the plurality of tanks disposed in parallel. A flow channel of a medium from the tanks is defined as the water outlet pipe and a flow channel of a medium into the tanks is defined as the water return pipe. The medium from the tanks is communicated with the plate heat exchanger unit through the water outlet pipe, and a cooling medium after heat exchange flows into the tanks through the water return pipe. A pressure transmitter, a temperature transmitter, an external circulating water pump, a flow rate sensor, a butterfly valve and a manually operated exhaust valve are disposed in sequence from the side of the tanks to the plate heat exchanger unit on the water outlet pipe. The water outlet pipe further includes a bypass branch having one end disposed between the flow rate sensor and the butterfly valve and the other end disposed between the manually operated exhaust valve and the plate heat exchanger unit, and a filter is disposed in the bypass branch. A Y-shaped filter is used in the present disclosure to guarantee the purity of the medium, avoid pipe blockage and avoid the entering impurity from adhering to the surface of the server to affect the performance of the server. Butterfly valves are disposed at two ends of the filter. In the present disclosure, sanitary butterfly valves are mostly used, which can better guarantee the sealing performance and are stable in performance and long in service life. All the above electrical apparatus elements are electrically connected to the control unit and transmit electrical signals to the control unit timely. The control unit, which is a programmable logic controller (PLC) control system, is configured to monitor whether parameters at various places meet requirements and give alerting information and the like timely. The control unit generally provides a stable flow rate and pressure for the liquid cooling system, and monitors and maintains the operation of the system.

The electrical apparatus elements for monitoring the parameters are commercially available. Alternatively, other electrical apparatus elements with this function on the market may also be used to replace the parts in the present disclosure. This belongs to the technical means well known to those skilled in the art and falls within the protection scope of the present disclosure. The operating principles of part of commercially available electrical apparatus elements are explained below. The operating principle of a single part is well-known. However, there are different setting requirements in different application environments, and it is not well-known how to set and how a plurality of electrical apparatus elements coordinates with one another.

The pressure transmitter is a device for converting a pressure into a pneumatic signal or an electric signal for control and remote transmission. The temperature transmitter uses a thermocouple or a thermal resistor as a temperature measuring element. A signal is output from the temperature measuring element to a transducer module, processed by circuits of voltage-stabilized filtering, operational amplification, nonlinear correction, V/I conversion, constant current and reverse direction protection and the like to be converted into a 4-20 mA current signal or 0-5 V/0-10 V voltage signal in a linear relationship with the temperature, and output as an RS485 digital signal. That is, the temperature transmitter is a device that converts the temperature into an electric signal for control and remote transmission. The pressure transmitter 515 and the temperature transmitter in the present disclosure are both electrically connected to a power distribution cabinet unit 4 to monitor the temperature and the pressure and to control and regulate the temperature and the pressure timely.

The flow rate sensor, which is a flow velocity monitoring apparatus, mainly functions in giving a detection signal when a flow velocity does not reach a set flow velocity threshold, and controlled by a computer to alert or start an interlocking protection system to protect key devices. The flow rate sensor is capable of preventing unexpected accidents during production timely and beneficial to production safety and economic benefits of an enterprise. In the present disclosure, the flow rate sensor is configured to monitor a flow rate, guarantee that the flow rate is capable of meeting the requirement of simultaneous cooling of a plurality of tanks and guarantee the cooling effect, i.e., guarantee the computational power of the servers and improving the working efficiency.

The exhaust valve is configured to expel excess air in the pipe. When there is air overflowing from the system, the air will climb up the pipe and finally gather at the highest point of the system. The exhaust valve is usually mounted at the highest point of the system. When air enters the cavity of the exhaust valve and gathers at the upper portion of the exhaust valve, the pressure rises with increasing air in the valve. When the air pressure is greater than the system pressure, the air will force the water level in the cavity to fall and a float bowl falls along with the water level to open an exhaust port. After the air is emptied, the water level rises and the float bowl rises therewith to close the exhaust port. Likewise, when a negative pressure is produced in the system, the water level in the valve cavity falls and the exhaust port is opened. Since the external atmospheric pressure is greater than the system pressure at this time, the atmosphere will enter the system through the exhaust port, preventing the hazard of the negative pressure.

The liquid cooling system includes a cooling tower, a secondary-side pipe and a cooling pipe. The secondary-side pipe is connected to a secondary-side medium outlet of the plate heat exchanger unit and used for cooling. The cooling pipe is connected to primary-side medium inlets of the cooling tower and the plate heat exchanger unit. A temperature transmitter, a pressure transmitter and a valve are disposed in the secondary-side pipe, in which at least one bypass pipe is disposed as a pipe for recovery and utilization of waste heat. In case of a large quantity of heat exchange and a large quantity of heat, a plurality of bypass pipes may also be provided as pipes for recovery of waste heat. After utilization of waste heat, the temperature of the medium drops after the heat in the medium is dissipated. The cooled medium may return again to the cooling pipe through a liquid return port for recovery of waste heat. Overall cyclic utilization of the medium is realized. The requirements of heat recovery and continued heating are met. Moreover, the stability of the medium flow rate is also guaranteed. A closed-loop circulating pipe is formed, which is conducive to overall adjustment and control. A filter, an exhaust valve, an internal circulating water pump, a temperature transmitter and a pressure transmitter are disposed in the cooling pipe. In the present disclosure, the internal circulating water pump may also be called a primary side pump. The above same electrical apparatus elements with the water outlet pipe and the water return pipe have the same functions, which will not be described redundantly here.

The internal circulating water pump controls start and stop of a cooling tower fan according to the temperature transmitter on the cooling pipe and an indoor ambient temperature, but does not control a running state of the cooling tower fan. In an automatic mode, after a local start command or a remote start command is received, the liquid cooling system starts automatically, and monitors a running status of the liquid cooling system and detects a system failure according to setting parameters. The control unit performs control by using a PLC program. The PLC automatically adjusts the temperature of the cooling water and the system pressure, and locally displays that the parameters of the liquid cooling system are out of limit timely, and an error signal light is on. The power of the internal circulating water pump is selected according to a medium flow rate and a medium transport path. The power of the main circulating water pump is determined, and a specification of the main circulating water pump is determined according to the power. In the present disclosure, a certain requirement is imposed on model selection, and multiple factors are taken into account. A total power is greater than a theoretically calculated power, and the safety coefficient is more than 1.5 times. When the water pump operates at full frequency, it vibrates greatly. In the present disclosure, a high-power water pump is selected. The water pump is selected to operate at a low frequency to reduce vibration, guaranteeing better stability within the whole system. The performance of each component is more reliable, and the vibration of the whole container is reduced.

Regarding the cooling tower, an open-type cooling tower is used for external cooling and heat exchange, and a closed cooling tower, a dry cooler, a fan coil and the like may also be used. When a wet bulb temperature is at 32° C., the flow rate is ≤87 $m^3/h$, the water inlet and outlet temperatures are 48° C. and 42° C. The heat dissipation capacity reaches 600 KW. In the present disclosure, the cooling tower may be replaced by other devices as long as they meet the requirements of heat exchange and cooling of the medium, which will not be particularly limited and all fall within the protection scope of the present disclosure.

The working process of the cooling tower is as follows: the returned water (hot water) of the system is conveyed to a middle water inlet of the cooling tower through the primary side pump and enters a tubular water knockout vessel. After being balanced, the water is uniformly sprayed onto the top of a filler by a large-orifice nozzle. The outlet pressure of the nozzle is relatively low, and the water flows from top to bottom along a preformed flow channel in the filler by gravity to form a uniform and stable water film. Meanwhile, fresh air enters the filler from bottom to top through air inlets on four sides of the bottom of the tower and passes through the filler section counter to the water. The temperature rise of the air and the evaporation of a small part of water together take away the heat and the heat is dissipated to the atmosphere through a top fan. The cooled water drips to a bottom water collecting basin for cyclic use by the system.

In the data center in the present disclosure, the tank unit is arranged centrally with a high density. After the tank unit is arranged within one container, the power may be up to 600 KW. After cooling, more than 98% of heat dissipated by the tank unit may be taken away. For example, 1000 KW of heat is dissipated by the tank unit, and after heat exchange, 98% of heat, i.e., 980 KW of heat, is taken away. The heat may be dissipated by means of the cooling tower. After heat exchange by the plate heat exchanger unit of the present disclosure, the high-temperature medium may be recycled for heating. Recovery and reutilization of heat are achieved.

The tank serves as the place for heat exchange between the cooling liquid and the computational power servers. A flute-shaped liquid separation pipe is disposed at the bottom of the tank to provide a uniform flow for each computational power server. It is designed that 48 computational power servers are placed in each tank. The computational power servers are placed in tank at upper and lower layers, 24 for each layer, and power interfaces of the computational power servers are all placed downwards. Under the action of the gravity, it is not easy for other impurities and the like to adhere to or enter the power interfaces, and the safety is improved. An interior material of tank is 304 stainless steel, and an external frame thereof is an enameled carbon steel material.

In the present disclosure, the water return pipe is laid in parallel to the length direction of each tank and arranged along the bottoms of the computational power servers. An outlet of cooling oil can be aligned to the computational power servers, providing better cooling effect. A hole is formed in the upper surface of the water return pipe such that oil comes out more uniformly. Thus, the cooling effect on each server is more uniform. Thus, the cooling effect on each server is more uniform. A liquid return box is further disposed within each tank. A water outlet pipe is connected to a bottom of the liquid return box. The water outlet pipe has a removable portion. When a height of the liquid return box needs to be reduced, the removable portion is removed. The liquid return box is of a box-shaped structure with open side up. Two ends of the liquid return box are removably connected to an inner wall of the tank. The liquid return box may be rapidly and fixedly connected to the inner wall of the tank conveniently by means of a locking groove mechanism or a quick screw connection structure or a T-shaped groove structure such that the liquid return box is adaptable to the computational power servers at different heights. The height of the liquid return box can be adjusted at any time according to the heights of the computational power servers, which may be beneficial to collection and return of the cooling medium after cooling. More preferably, a mesh is mounted within the liquid return box so that a return flow can be more uniform.

In the present disclosure, a plurality of containers may also be arranged in parallel. A plurality of container structures may be controlled simultaneously, and a single container may also be controlled separately. The maximum overall dimensions of a single container are L6058×W2438×H2896 (mm), which meet the certification requirements of China classification society and UL. The overall protection grade of the container is IP53, and a material thereof is SPA-H steel plate or similar weather-resistant steel plate. The corrosion-proof grade is C3. All door frame waterproof plates are sealed without leakage, and the bottom is designed with an overhead electrostatic floor. More preferably, a fan is further disposed on the container to realize air flowing inside and outside the container, and a small quantity of heat is dissipated in this manner. Still further, a temperature and humidity transmitter is further disposed on the container to monitor the temperature and the humidity. Photoelectric leaking oil detection sensors are disposed on two sides of the container, respectively, and transmit electric signals to an electric control cabinet unit to realize detection of the cooling medium oil, avoid oil leakage and guarantee the flow rate and the cooling effect of the cooling medium. Apart from the photoelectric leaking oil detection, other leaking oil detection ways may also be adopted.

More preferably, a double door is disposed at one end of the container in a length direction as a passage for daily operation and maintenance equipment and personnel to go in and out. A fresh air inlet shutter is disposed on the double door. A fresh air exhaust fan is disposed within the container at a position corresponding to the fresh air inlet shutter, which is conducive to air circulation inside and outside the container. A small quantity of heat is dissipated in this natural heat dissipation way. An access control card reader is further disposed outside the double door to authenticate identity, guaranteeing that only authenticated operating personnel or management personnel can pass therethrough and improving the safety of the whole device. An inspection door is disposed on one side of the container in the length direction as a door for maintenance of the plate heat exchanger unit and the water pumps. The inspection door is not normally open. A main cable/copper bar connection interface is further disposed on a side of the container. In addition, a housing grounded point is further disposed at the bottom of a side of a machine housing, which is earthed to guarantee the safety of the container in use.

The specific cooling process is as follows: the housing of the container is certified by China classification society and can be convenient for sea transportation and land transportation. In a single-phase liquid immersion cooling heat dissipation system, a single-phase insulating cooling oil for heat dissipation is placed in the tank unit within the container to immerse servers. The heat of the servers is brought through circulation by the water pumps to the plate heat exchanger for cooling. The hot oil in the plate heat exchanger exchanges heat with the cooling water in external circulation and thus is cooled. The cooled oil is conveyed into the tank to cool the servers again. The cooling water externally circulates through the water pump to an outdoor cooling tower or a dry cooler for heat dissipation and cooling and eventually dissipates the heat of the servers to air. An external circulating pipe may also be connected to a heating system to provide hot water thereto. The water cooled after heat dissipation in the heating system returns to the cooling pipe. Thus, a closed loop is formed.

The product of the present disclosure is also referred to as tank box, which has good environmental adaptability, good cooling effect and high adaptability to the environment, is runnable at a high temperature and can guarantee the cooling effect. The arrangement flexibility of tank box is high. With a containerized structure, the liquid cooling system is disposed at the upper end of the container and occupies small space. A parallel layout can be achieved conveniently and rapidly. A plurality of tanks may be selected to operate simultaneously, or one or more of the tanks may be selected to operate. For the hosting requirements of different servers, tank box can be adjusted flexibly to adapt to servers of different brands and models. The present disclosure allows for rapid adjustment and setting according to an actual environment and adopts excellent solutions at low overall cost. tank box adapts to the development of servers by providing an industry-leading liquid immersion cooling solution and offers users with the possibility of making an advanced arrangement for future use. The updating cost of infrastructures due to upgrading of servers is significantly reduced. Meanwhile, the liquid immersion cooling solution solves common problems such as fan failure, noise, dust and corrosion during the operation of air-cooled servers and significantly improves the operational reliability of the servers. Due to the efficient response of the liquid immersion cooling to common problems such as system overheating and temperature fluctuation during the operation of servers, the servers are enabled to easily adapt to extreme environments of from the lowest −40° C. to the highest 50° C. (wet bulb 32° C.). In addition, the more efficient heat dissipation solution makes overclocking of up to 50%-70% of servers go well.

On the basis of running the liquid immersion cooling solution, tank box has a waste heat recovery interface reserved for users, making recovery of waste heat of servers possible. Efficient recovery of waste heat can be extensively applied to agricultural and industrial heat utilization scenarios and the like. The design solution which provides a better understanding of customer's demands and is more flexible can meet arbitrary hosting requirements of different servers. Secondary utilization of energy is realized: it is convenient for customers to utilize the heat of servers taken away by the liquid cooling medium for agricultural and industrial heat utilization scenarios and the like. Carbon emissions are reduced and environmental protection is achieved. The following two environmental protection modes are realized: clean power+tank box+agricultural scenario=negative carbon emission; and clean power+tank box+industrial scenario=halved carbon emission.

The foregoing is detailed description of one embodiment of the present disclosure, which is merely a preferred embodiment of the present disclosure and cannot be construed as limiting the scope of implementation of the present disclosure. Any equivalent modifications, improvements, and the like made within the application scope of the present disclosure should fall within the protection scope of the present disclosure.

What is claimed is:

1. A containerized single-phase liquid immersion cooling system, comprising a tank unit, a power distribution unit, a plate heat exchanger unit and a control unit that are disposed within a container, and a liquid cooling system disposed outside the container; wherein the tank unit comprises a plurality of tanks disposed in parallel; a plurality of computational power servers are placed in each tank containing a cooling liquid, and the tank serves as a place for heat exchange between the cooling liquid and the computational power servers;

the liquid cooling system is configured to cool a secondary-side medium from the plate heat exchanger unit and dissipate heat to an external environment; a bypass pipe is disposed between the plate heat exchanger unit and the liquid cooling system; the secondary-side medium in the bypass pipe is configured to communicate with an external device through a hot water outlet, and then returns to a cold water pipe;

the plate heat exchanger unit serves as a heat exchange center to cool the tank unit;

the power distribution unit supplies power for the liquid immersion cooling system; and the control unit provides a stable flow rate and pressure for the liquid immersion cooling system, and monitors and maintains operation of the liquid immersion cooling system; the control unit is a programmable logic controller (PLC) control system; electrical apparatus elements of the tank unit are electrically connected to the control unit and transmit electrical signals to the control unit.

2. The liquid immersion cooling system according to claim 1, wherein the tank unit further comprises one water outlet pipe and one water return pipe that are shared by the plurality of tanks disposed in parallel; a flow channel for a medium flowing out from the tanks is defined as the water outlet pipe and a flow channel for the medium flowing into the tanks is defined as the water return pipe; the medium from the tanks is communicated with the plate heat exchanger unit through the water outlet pipe; and the medium cooled after heat exchange flows into the tanks through the water return pipe.

3. The liquid immersion cooling system according to claim 2, wherein a pressure transmitter, a temperature transmitter, an external circulating water pump, a flow rate sensor, a control valve and an exhaust valve are disposed in sequence in the water outlet pipe between the tanks and the plate heat exchanger unit; the water outlet pipe further comprises a bypass branch having one end disposed between the flow rate sensor and a butterfly valve and an other end disposed between a manually operated exhaust valve and the plate heat exchanger unit; and a filter is disposed in the bypass branch.

4. The liquid immersion cooling system according to claim 2, wherein the plurality of computational power servers placed in each tank are arranged into a plurality of layers up and down, and power interfaces of the computational power servers are all placed downwards; the water return pipe is laid in parallel to a length direction of the tank and arranged along bottoms of the computational power servers; and a hole is formed in an upper surface of the water return pipe.

5. The liquid immersion cooling system according to claim 2, wherein a liquid return box is further disposed within each tank; the water outlet pipe is connected to a bottom of the liquid return box; the water outlet pipe has a removable portion, and the removable portion is selectively mounted according to a height of the liquid return box; the liquid return box is of a box-shaped structure with open side up; two ends of the liquid return box are removably connected to an inner wall of the tank; and a mesh is mounted within the liquid return box.

6. The liquid immersion cooling system according to claim 1, wherein the liquid cooling system comprises a cooling tower, a secondary-side pipe for connection with a secondary-side medium outlet of the plate heat exchanger unit and the cooling tower, and a cooling pipe for connection with the cooling tower and a cold medium inlet of the plate heat exchanger unit.

7. The liquid immersion cooling system according to claim 6, wherein a temperature transmitter, a pressure transmitter and a valve are disposed in the secondary-side pipe; and a filter, an exhaust valve, an internal circulating water pump, a temperature transmitter and a pressure transmitter are disposed in the cooling pipe.

8. The liquid immersion cooling system according to claim 7, wherein a power of the internal circulating water pump is selected according to a medium flow rate and a medium transport path; a total power is greater than a theoretically calculated power; and a safety coefficient is more than 1.5 times of a theoretically calculated safety coefficient.

9. The liquid immersion cooling system according to claim 1, wherein the container has an overall protection grade of IP53 and a corrosion-proof grade of C3; and a fan, a temperature and humidity transmitter and a leaking oil detection sensor are further disposed on the container.

10. The liquid immersion cooling system according to claim 1, wherein a double door is disposed at one end of the container in a length direction as a passage for daily operation and maintenance equipment and personnel to go in and out; a fresh air inlet shutter is disposed on the double door; a fresh air exhaust fan is disposed within the container at a position corresponding to the fresh air inlet shutter; an access control card reader is further disposed outside the double door to authenticate identity; and an inspection door is disposed on one side of the container in the length direction as a door for maintenance of the plate heat exchanger unit and water pumps.

* * * * *